United States Patent
Hekmatshoartabari et al.

(10) Patent No.: US 11,177,225 B2
(45) Date of Patent: Nov. 16, 2021

(54) SEMICONDUCTOR DEVICE INCLUDING PHYSICAL UNCLONABLE FUNCTION

(71) Applicant: International Business Machines Corporation, Armonk, NY (US)

(72) Inventors: Bahman Hekmatshoartabari, White Plains, NY (US); Takashi Ando, Eastchester, NY (US); Alexander Reznicek, Troy, NY (US); Nanbo Gong, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 39 days.

(21) Appl. No.: 16/781,196

(22) Filed: Feb. 4, 2020

(65) Prior Publication Data

US 2021/0242142 A1 Aug. 5, 2021

(51) Int. Cl.
| | | |
|---|---|---|
| H01L 21/44 | (2006.01) | |
| H01L 23/52 | (2006.01) | |
| H01L 23/00 | (2006.01) | |
| H01L 21/02 | (2006.01) | |
| H01L 21/768 | (2006.01) | |
| H01L 49/02 | (2006.01) | |

(52) U.S. Cl.
CPC ........ *H01L 23/573* (2013.01); *H01L 21/0228* (2013.01); *H01L 21/02636* (2013.01); *H01L 21/76871* (2013.01); *H01L 28/56* (2013.01); H01L 2221/1084 (2013.01)

(58) Field of Classification Search
CPC .................... H01L 21/76871; H01L 28/56
USPC .................. 438/627, 643, 653; 257/751, 781
See application file for complete search history.

(56) References Cited

U.S. PATENT DOCUMENTS

| | | | | |
|---|---|---|---|---|
| 5,945,673 | A * | 8/1999 | Beratan | G01J 5/34 250/338.3 |
| 6,358,810 | B1 * | 3/2002 | Dornfest | H01L 28/55 438/396 |
| 6,664,168 | B1 * | 12/2003 | Andideh | H01L 28/55 438/396 |
| 6,890,768 | B2 * | 5/2005 | Karaswaw | H01L 21/31691 438/3 |
| 8,737,111 | B2 | 5/2014 | Kreupl | |
| 9,397,288 | B2 * | 7/2016 | Ohmori | H01L 43/08 43/12 |
| 9,768,231 | B2 | 9/2017 | Tran | |
| 10,411,067 | B2 | 9/2019 | Then | |

(Continued)

FOREIGN PATENT DOCUMENTS

EP 3343601 A1 7/2018

OTHER PUBLICATIONS

"Physical unclonable function", Wikipedia, This page was last edited on Nov. 27, 2019, at 14:06 (UTC), 7 pages, <https://en.wikipedia.org/wiki/Physical_unclonable_function>.

(Continued)

*Primary Examiner* — Calvin Lee
(74) *Attorney, Agent, or Firm* — David K. Mattheis; Maeve M. Carpenter

(57) ABSTRACT

Fabrication of a physically unclonable function containing semiconductor device by fabricating a first electrode of the semiconductor device, randomly nucleating material regions upon a surface of the first electrode and forming a second electrode upon the first electrode and at least a portion of the randomly nucleated regions.

20 Claims, 3 Drawing Sheets

(56) References Cited

U.S. PATENT DOCUMENTS 10,636,802 B2* 4/2020 Yu .................... H01L 27/11521
2018/0287793 A1 10/2018 Khatib Zadeh
2019/0042201 A1 2/2019 Ielmini

OTHER PUBLICATIONS

Evans et al., "From Initial to Late Stages of Epitaxial Thin Film Growth: STM Analysis and Atomistic or Coarse-Grained Modeling", AIP Conference Proceedings vol. 1270, Issue 1, Abstract, Published Online Jul. 20, 2010, 4 pages, <https://aip.scitation.org/doi/10.1063/1.3476231>.
Hibma, T., "Thin Layers of Transition Metal Oxides", SCOOTMO Presentation, University of Groningen, The Netherlands, Last updated Jan. 23, 2006, 38 pages, <http://home.agh.edu.pl/~scootmo/download/groningen_th.ppt>.
Le et al., "Thermoelectric and Topological Insulator Bismuth Chalcogenide Thin Films Grown Using Pulsed Laser Deposition", Intech, © 2016 The Author(s), Licensee InTech, 31 pages, <http://dx.doi.org/10.5772/65898>.
Yanambaka et al., "Making Use of Manufacturing Process Variations: A Dopingless Transistor Based-PUF for Hardware-Assisted Security", IEEE Transactions on Semiconductor Manufacturing, vol. 31, No. 2, May 2018, pp. 285-294.

* cited by examiner

SEMICONDUCTOR DEVICE INCLUDING PHYSICAL UNCLONABLE FUNCTION

BACKGROUND

The disclosure relates generally to semiconductor device including a physically unclonable function (PUF). The disclosure relates particularly to semiconductor devices including a PUF formed during device fabrication.

A physical, or physically, unclonable function (PUF) provides semiconductor devices with a unique identification means derived from a physically defined "digital fingerprint". PUF arise from physical variations between otherwise identical devices, providing an individual identifier for each device. PUF operate within a challenge-response authentication protocol. A specific physical stimulus applied to a device including a PUF yields a repeatable but unpredictable response. The stimulus and response are considered the challenge response pair and uniquely identify the device. The authentication action does not reveal the nature of the PUF within the device, rendering the PUF resistant to spoofing attacks seeking to replicate the PUF.

SUMMARY

The following presents a summary to provide a basic understanding of one or more embodiments of the disclosure. This summary is not intended to identify key or critical elements or delineate any scope of the particular embodiments or any scope of the claims. Its sole purpose is to present concepts in a simplified form as a prelude to the more detailed description that is presented later.

In one aspect, fabrication of a physically unclonable function containing semiconductor device by fabricating a first electrode of the semiconductor device, randomly nucleating material regions upon a surface of the first electrode and forming a second electrode upon the first electrode and at least a portion of the randomly nucleated regions.

In one aspect, a semiconductor device including a physically unclonable function, the device includes a first electrode, randomly nucleated regions disposed upon a surface of the first electrode and a second electrode disposed in electrical contact with the first electrode and randomly generated regions.

BRIEF DESCRIPTION OF THE DRAWINGS

Through the more detailed description of some embodiments of the present disclosure in the accompanying drawings, the above and other objects, features and advantages of the present disclosure will become more apparent, wherein the same reference generally refers to the same components in the embodiments of the present disclosure.

DETAILED DESCRIPTION

Figure 1:
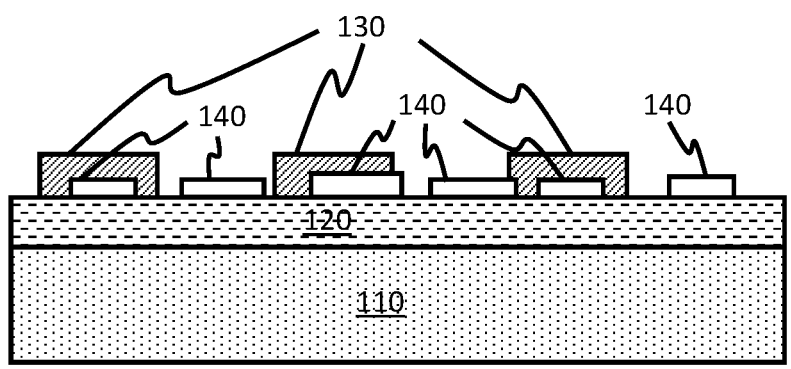
FIG. 1 provides a cross-sectional view of a step in the fabrication of a semiconductor device, according to an embodiment of the invention. The figure illustrates a formed PUF consisting of a lower electrode, nucleated barrier materials, and an upper electrode.

Some embodiments will be described in more detail with reference to the accompanying drawings, in which the embodiments of the present disclosure have been illustrated. However, the present disclosure can be implemented in various manners, and thus should not be construed to be limited to the embodiments disclosed herein.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not tended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations and the spatially relative descriptors used herein can be interpreted accordingly. In addition, be understood that when a layer is referred to as being "between" two layers, it can be the only layer between the two layers, or one or more intervening layers cat also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Incorporating a PUF within a semiconductor device enables the use of challenge response authentication including a unique identifier for each device. Disclosed embodiments of the invention provide simple and effective ways to include a PUF within semiconductor devices using current fabrication methods.

The disclosure focuses upon the formation of a PUF at a device cross-point between device electrodes. This is by way of illustrating the invention and is not intended to be limiting in any way. The disclosed invention embodiment may be added to any device junction for the purpose of adding a device PUF. Device locations for formation of the PUF include, without being limiting, cross-point junctions, all other direct electrode element junctions, indirect electrode element junctions including any junctions including a selector device, or switching element, disposed between two electrode elements. Exemplary switching elements include transistors, ovonic threshold switches (OTS) and diodes.

The disclosed inventions create a unique electrical resistance at a specific device junction, enabling the challenge-response authentication of the device. After device fabrication and completion, a stimulus applied to the device PUF yields a unique, repeatable response for each device according to the unique resistance of the device PUF. For example, a known voltage applied to the PUF results in a repeatable, device specific current across the PUF according to the resistance of the PUF. Application of the same voltage results in the same device specific current each time.

In an embodiment illustrated in FIG. 1, the PUF includes a first lower electrode element 120 and a second upper electrode element 130. In this embodiment, the upper electrode element 130 includes a pattern of electrode elements disposed in electrical communication with, and orthogonally to, the lower electrode element 120. In an embodiment, the pattern of the upper electrode element 130 includes a repeating pattern of elements, such as a series of electrode elements disposed with similar or identical spacing between adjacent electrode elements of the patterned portion of the electrode. In this embodiment, a random pattern of insulating or rectifying barrier material 140 is disposed between the lower electrode element 120 and upper electrode element 130.

In an embodiment, standard complementary metal-oxide-semiconductor (CMOS) fabrication techniques are used to form the first, lower electrode element 120. In this embodiment, the lower electrode element 120 is formed of a conductive metal or a highly doped semiconductor material deposited upon an underlying substrate or partially formed semiconductor device. In this embodiment, barrier material 140, insulators such as a dielectric material including oxides and nitrides, or undoped semiconductor material, and rectifying materials such as doped semiconductor materials depending upon the materials of the upper and lower electrodes, are deposited upon the upper surface of the lower electrode element 120.

Deposition of the barrier material 140 proceeds through nucleation of the material upon the surface of the lower electrode element 120. Deposition does not continue to the point of forming a complete film or coating of material upon the surface of the lower electrode element 120. Nucleation refers to the clustering or grouping of molecules of the barrier material upon the surface, typically, but not necessarily, in a single layer of molecules upon the surface. Clusters expand in size as the deposition process continues and a complete film or layer of barrier material would eventually form upon the electrode surface given sufficient deposition process duration.

CMOS deposition methods including e.g., chemical vapor deposition (CVD), physical vapor deposition (PVD), atomic layer deposition (ALD), or gas cluster ion beam (GCIB) deposition. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

In an embodiment, after fabrication of the lower electrode element 120, ALD proceeds long enough to enable barrier material 140—such as a high-k dielectric or other suitable barrier material—nucleation to occur upon the lower electrode element 120 upper surface. Controlling barrier material 140 arrival rates, barrier material 140 energy levels and lower electrode element 120 temperature also controls deposition and nucleation rates of the barrier material 140 upon the lower electrode element 120. Nucleation produces a random distribution of the barrier material 140 upon the surface of the lower electrode element 120. After fabrication of the upper electrode element 130 upon the lower electrode element 120—nucleated barrier material 140 combination, the random distribution of the barrier material 140 yields a device specific barrier percentage between the lower electrode element 120 and upper electrode element 130, yielding a device specific electrical effect for the junction. (A unique junction resistance or degree of current rectification associated with the amount of barrier present in the junction.)

In an embodiment, deposition of barrier material 140 proceeds by flash deposition. In this embodiment, a shutter between a high vapor concentration of the barrier material 140 and the target device in a low barrier material vapor concentration environment is opened for a controlled amount of time. Barrier material 140 diffuses into the low concentration environment and deposits upon the lower electrode element 120 surface. Controlling the relative vapor concentrations, material energy and shutter open duration control the extent to which nucleation covers the target surface(s). Nucleation sites are randomly distributed across the target surface(s) of the device, again yielding the desired device specific PUF response for use in a challenge response authentication protocol.

In an embodiment, deposition and nucleation of the barrier material 140 upon the lower electrode element 120 proceeds using epitaxial growth processes. As an example, germanium can be epitaxially grown upon the lower electrode to yield a random distribution of nucleated clusters of pure germanium upon the lower electrode. The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

In this embodiment, the energy of the barrier material vapor and the energy difference between the barrier material source and the target surface are manipulated to control the extent of the nucleation upon the surface over time. Deposition of the barrier material 140 progresses to yield a random pattern of nucleated barrier material patches or clusters upon the target lower electrode element 120 surface. The process stops before a complete layer of barrier material 140 forms upon the target surface of lower electrode element 120.

Figure 2:
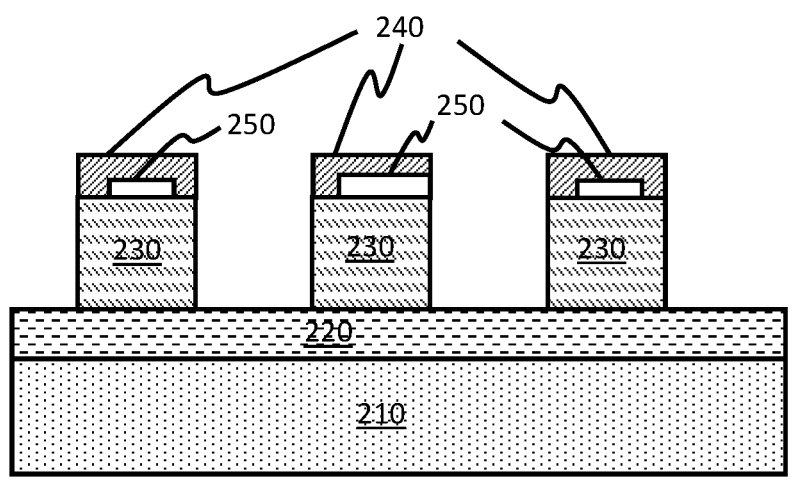
FIG. 2 provides a cross-sectional view of a step in the fabrication of a semiconductor device, according to an embodiment of the invention. The figure illustrates a formed PUF consisting of a lower electrode, switching elements, nucleated barrier materials, and an upper electrode.

In an embodiment, illustrated in FIG. 2, deposition of the barrier material 250 occurs upon the upper electrode of a switching element 230 disposed between a lower electrode element 220 and the upper electrode element 240 of the PUF. Exemplary switching elements 230 include, without being limiting, diodes, transistors, and ovonic threshold switches. After fabrication of the switching element 230, barrier material 250 deposition upon an upper electrode of the switching element 230 occurs as described above.

In an embodiment, upper and lower electrodes are each composed of a conductive metal material such as tungsten, nickel, titanium, molybdenum, tantalum, copper, platinum, silver, gold, ruthenium, iridium, rhenium, and rhodium and alloys thereof including titanium aluminum, tantalum nitride and titanium nitride alloys, and the barrier material is composed of a high-k dielectric material such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate and combinations thereof grown by ALD, or an insulator such as alumina oxide deposited using flash deposition.

In an embodiment, a first electrode is composed of a p-type silicon. As used herein, "p-type" refers to the addition of impurities to an intrinsic semiconductor that creates deficiencies of valence electrons. In a silicon-containing semiconductor, examples of p-type dopants, i.e., impurities, include but are not limited to: boron, aluminum, gallium and indium. In this embodiment, the barrier material is composed of an n-type silicon material deposited as described above. As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous. In this embodiment, the upper electrode consists of a metal such as tungsten, nickel, titanium, molybdenum, tantalum, copper, platinum, silver, gold, ruthenium, iridium, rhenium, and rhodium and alloys thereof including titanium aluminum, tantalum nitride and titanium nitride alloys.

As illustrated in FIG. 1, device PUF 100 includes a first, lower electrode element 120 disposed upon underlying substrate 110. Lower electrode element 120 consists of a conductive metal such as tungsten, nickel, titanium, molybdenum, tantalum, copper, platinum, silver, gold, ruthenium, iridium, rhenium, and rhodium and alloys thereof including titanium aluminum, tantalum nitride and titanium nitride alloys, or a highly doped p-type or n-type silicon semiconductor material as described above. Upper electrode element 130 is formed in a pattern orthogonal to lower electrode element 120. Upper electrode element 130 also consists of a metal or a highly doped p-type or n-type semiconductor material. Prior to the fabrication of upper electrode element 130, barrier material 140 is randomly nucleated across the upper surface of lower electrode element 120. Barrier material 140 consists of an insulating material such as a dielectric, or a material such as silicon, germanium, or mixture thereof, with dopants of opposite polarity to those of upper electrode element 130 and/or lower electrode element 120, forming a rectifying junction with either the upper electrode element 130, or lower electrode element 120. In this embodiment, barrier material 140 provides a device specific electrical property to the PUF due to the random distribution of barrier material 140 between the lower electrode element 120 and the upper electrode element 130. The random distribution of barrier material 140 yields device specific patterns of the material in terms of size and location imparting device specific electrical properties. Barrier material 140 is disposed in different locations and different amounts upon the surface of lower electrode in each fabricated device.

As illustrated in FIG. 2, device PUF 200 includes a first, lower electrode element 220 disposed upon underlying substrate 210. Lower electrode element 220 consists of a conductive metal such as tungsten, nickel, titanium, molybdenum, tantalum, copper, platinum, silver, gold, ruthenium, iridium, rhenium, and rhodium and alloys thereof including titanium aluminum, tantalum nitride and titanium nitride alloys, or a highly doped p-type or n-type silicon semiconductor material as described above. Switching elements 230 are disposed upon the upper surface of lower electrode 220. Switching elements 230 consist of diodes, OTS, or transistors. Upper electrode element 240 is formed in a pattern orthogonal to lower electrode element 220 upon the upper surfaces of switching elements 230, in the illustrated embodiment, upper electrode element 240 is disposed in a periodic pattern. Upper electrode element 240 also consists of a metal or a highly doped p-type or n-type semiconductor material. Prior to the fabrication of upper electrode element 240 upon switching elements 230, barrier material 250 is randomly nucleated across the upper surface of switching elements 230. Barrier material 250 consists of an insulating material such as a dielectric, or a material forming a rectifying junction with either the upper electrode element 240, or the electrode of switching element 230. In this embodiment, barrier material 250 imparts a device specific electrical property to the PUF due to the random distribution of barrier material 250 between the switching elements 230 and the upper electrode element 240. The device specificity arises due to the random distribution producing device specific regions in terms of size, shape and location of the rectifying junction regions between the upper electrode element 240 and switching elements 230.

Figure 3:
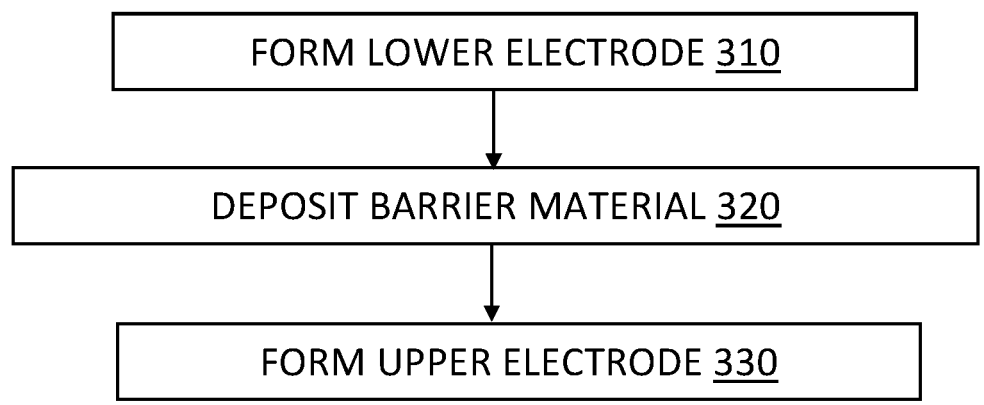
FIG. 3 provides a flowchart depicting operational steps for forming semiconductor device, according to an embodiment of the invention.

Flowchart 300 of FIG. 3 sets forth operational steps in the fabrication of the PUF for semiconductor devices according to the disclosed embodiments of the invention. As shown in the figure, at block 310, a first, lower electrode of a device is fabricated using CMOS methods. The lower electrode consists of a metal or a doped semiconductor. In an embodiment, the lower electrode is disposed in a periodic pattern upon the underlying device.

At block 320, a barrier material is deposited to a nucleation stage upon the first electrode of block 310. The barrier material may be deposited using known material deposition methods including ALD, flash deposition and epitaxial growth methods. The barrier material may consist of an electrically insulating material or a material which forms a rectifying junction in combination with the materials of either the upper or lower electrodes of the PUF. In an embodiment, the barrier material forms a rectifying junction in combination with the lower electrode material of the PUF. In an embodiment, the barrier material forms a rectifying junction in combination with the material of the upper PUF electrode.

At block 330, an upper electrode is fabricated using known CMOS methods. The upper electrode is disposed in contact with the lower electrode and the nucleated barrier material such that the nucleated barrier material reduces the contact area between the upper and lower electrodes. In an embodiment, a switching element such as a diode, OTS, or transistor is fabricated between the lower and upper electrodes. In this embodiment, the barrier material is nucleated upon the upper electrode of the switching element. The upper electrode of the PUF is fabricated in contact with the nucleated barrier material and the upper electrode of the switching element. The barrier material reduces the contact area between the upper PUF electrode and the upper switching element electrode in an unpredictable manner, creating the necessary physical conditions for the PUF. FIGS. 1 and 2 illustrate the reduction of contact area between lower electrode element 130 and upper electrode by the random distribution of barrier material 140, as well as between switching element 230 and upper electrode 240 by the presence and random distribution of barrier material 250. Each device has a unique distribution of the barrier material due to the randomly nucleated, and incomplete coverage of the barrier material layer between the upper and lower portions of the junction. Each device has a unique distribution of material in terms of the quantity and location of the barrier material in the junction.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method of fabricating a semiconductor device, the method comprising:
   fabricating a first electrode of the semiconductor device;

randomly nucleating material regions upon a surface of the first electrode;

forming a second electrode upon the first electrode and at least a portion of the randomly nucleated material regions; and forming a selector device in electrical communication with the first and second electrodes, wherein the selector device includes at least one of a diode, transistor and threshold switch, and wherein the barrier element forms a rectifying junction with at least one of the first and second electrodes.

2. The method of fabricating a semiconductor device according to claim 1, wherein randomly nucleating material regions comprises atomic layer deposition of a high-k dielectric material.

3. The method of fabricating a semiconductor device according to claim 1, further comprising forming a selector device in electrical communication with the first and second electrodes.

4. The method of fabricating a semiconductor device according to claim 1, wherein randomly nucleating material regions comprises epitaxial growth of a doped semiconductor.

5. The method of fabricating a semiconductor device according to claim 1, wherein randomly nucleating material regions comprises flash deposition of an insulating material.

6. The method of fabricating a semiconductor device according to claim 1, wherein the randomly nucleated material regions comprise an insulating material.

7. The method of fabricating a semiconductor device according to claim 1, wherein at least one of the first and second electrodes comprises a pattern.

8. A physical unclonable function (PUF) device comprising a first electrode, randomly nucleated material regions disposed upon the first electrode, and a second electrode disposed in a pattern in electrical communication with the first electrode and the randomly nucleated material regions; wherein the barrier element forms a rectifying junction with at least one of the first and second electrodes, wherein at least one of the first and second electrodes is connected to a selector device, and wherein the selector device includes at least one of a diode, transistor and threshold switch.

9. The semiconductor device according to claim 8, wherein the randomly nucleated material regions form a rectifying junction with at least one of the first and second electrodes.

10. The semiconductor device according to claim 8, wherein the randomly nucleated material regions comprise an insulating material.

11. The semiconductor device according to claim 8, wherein the pattern comprises a periodic pattern.

12. The semiconductor device according to claim 8, wherein at least one of the first and second electrodes is connected to a selector device.

13. The semiconductor device according to claim 12, wherein the selector device includes at least one of a diode, transistor and threshold switch.

14. A physical unclonable function device (PUF) device comprising:
a first electrode;
a second electrode disposed adjacent to and in electrical contact with the first electrode;
a barrier element disposed between the first electrode and the second electrode;
wherein the barrier element comprises randomly nucleated regions; and
wherein the barrier element forms a rectifying junction with at least one of the first and second electrodes,
wherein at least one of the first and second electrodes is connected to a selector device, and
wherein the selector device includes at least one of a diode, transistor and threshold switch.

15. The semiconductor device according to claim 14, wherein the barrier element forms a rectifying junction with at least one of the first and second electrodes.

16. The semiconductor device according to claim 14 wherein at least one of the first and second electrodes is disposed in a pattern.

17. The semiconductor device according to claim 14 wherein the barrier element comprises an insulating material.

18. The semiconductor device according to claim 16 wherein the pattern includes a periodic pattern.

19. The semiconductor device according to claim 14, wherein at least one of the first and second electrodes is connected to a selector device.

20. The semiconductor device according to claim 19, wherein the selector device includes at least one of a diode, transistor and threshold switch.

* * * * *